United States Patent
Zhang et al.

(10) Patent No.: US 7,803,704 B2
(45) Date of Patent: Sep. 28, 2010

(54) RELIABLE INTERCONNECTS

(75) Inventors: Bei Chao Zhang, Singapore (SG); Chim Seng Seet, Singapore (SG); Juan Boon Tan, Singapore (SG); Fan Zhang, Singapore (SG); Yong Chiang Ee, Singapore (SG); Bo Tao, Singapore (SG); Tong Qing Chen, Singapore (SG); Liang Choo Hsia, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 12/196,291

(22) Filed: Aug. 22, 2008

(65) Prior Publication Data

US 2010/0044869 A1 Feb. 25, 2010

(51) Int. Cl.
*H01L 21/4763* (2006.01)

(52) U.S. Cl. ............... 438/622; 438/627; 438/643; 257/734; 257/751

(58) Field of Classification Search ............... 438/622, 438/627, 643, 653; 257/734, 751, E21.476, 257/E21.584
See application file for complete search history.

(56) References Cited

U.S. PATENT DOCUMENTS

| | | | |
|---|---|---|---|
| 5,674,787 A | 10/1997 | Zhao et al. | |
| 6,181,013 B1 | 1/2001 | Liu et al. | |
| 6,274,499 B1 | 8/2001 | Gupta et al. | |
| 6,670,274 B1 | 12/2003 | Liu et al. | |
| 6,706,625 B1 | 3/2004 | Sudijono et al. | |
| 6,846,683 B2 * | 1/2005 | Low | 438/3 |
| 6,893,959 B2 | 5/2005 | Barth | |
| 7,524,755 B2 * | 4/2009 | Widodo et al. | 438/627 |
| 2006/0160349 A1 | 7/2006 | Wong et al. | |
| 2006/0172527 A1 | 8/2006 | Marxsen et al. | |
| 2008/0233745 A1 * | 9/2008 | Chang et al. | 438/687 |
| 2009/0045519 A1 * | 2/2009 | Kamikubo | 257/773 |
| 2009/0166868 A1 * | 7/2009 | Lee et al. | 257/751 |
| 2009/0176369 A1 * | 7/2009 | Nickel et al. | 438/687 |

* cited by examiner

*Primary Examiner*—Phuc T Dang
(74) *Attorney, Agent, or Firm*—Horizon IP Pte. Ltd.

(57) ABSTRACT

A method for forming a semiconductor device is presented. The method includes providing a substrate prepared with a dielectric layer formed thereon. The dielectric layer having a conductive line disposed in an upper portion of the dielectric layer. The substrate is processed to produce a top surface of the dielectric layer that is not coplanar with a top surface of the conductive line to form a stepped topography.

20 Claims, 12 Drawing Sheets

RELIABLE INTERCONNECTS

BACKGROUND

The fabrication of integrated circuits (ICs) involves the formation of features on a substrate that make up circuit components, such as transistors, resistors and capacitors. The devices are interconnected, enabling the IC to perform the desired functions. Interconnections are formed by forming contacts and conductive lines in a dielectric layer using, for example, damascene techniques. A damascene structure, for example, includes a via or contact hole in a lower portion and a trench which is generally wider than the contact hole in an upper portion. The via serves as a contact to a device while the trench contains the conductive line for connecting the device to, for example, other devices.

As critical dimensions (CD) continue to shrink, time dependent dielectric breakdown (TDDB) has become an important reliability issue. For example, the destruction of the dielectric layer can cause interconnects to short, rendering the IC defective.

From the foregoing discussion, it is desirable to improve TDDB to increase IC reliability.

SUMMARY

Embodiments generally relate to a semiconductor devices and methods of forming a semiconductor device. In one embodiment, a method for forming a semiconductor device is presented. The method includes providing a substrate prepared with a dielectric layer formed thereon. The dielectric layer has a conductive line disposed in an upper portion of the dielectric layer. The method includes processing the substrate to produce a top surface of the dielectric layer that is not coplanar with a top surface of the conductive line to form a stepped topopgraphy. In another embodiment, the top surface of the dielectric layer is below or above the top surface of the conductive wherein such configuration improves TDDB.

A semiconductor device is disclosed in one embodiment. The semiconductor device includes a substrate and a dielectric layer on the substrate. The dielectric layer has a conductive line in an upper portion thereof. A top surface of the dielectric layer and a top surface of the conductive line form a stepped topography.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relates to ICs. More particularly, the present invention relates to interconnections and processes for forming such ICs. The ICs can be any type of IC, for example dynamic or static random access memories, signal processors, or system-on-chip devices. The ICs can be incorporated into, for example, consumer electronic products, such as computers, cell phones, and personal digital assistants (PDAs).

Figure 1:
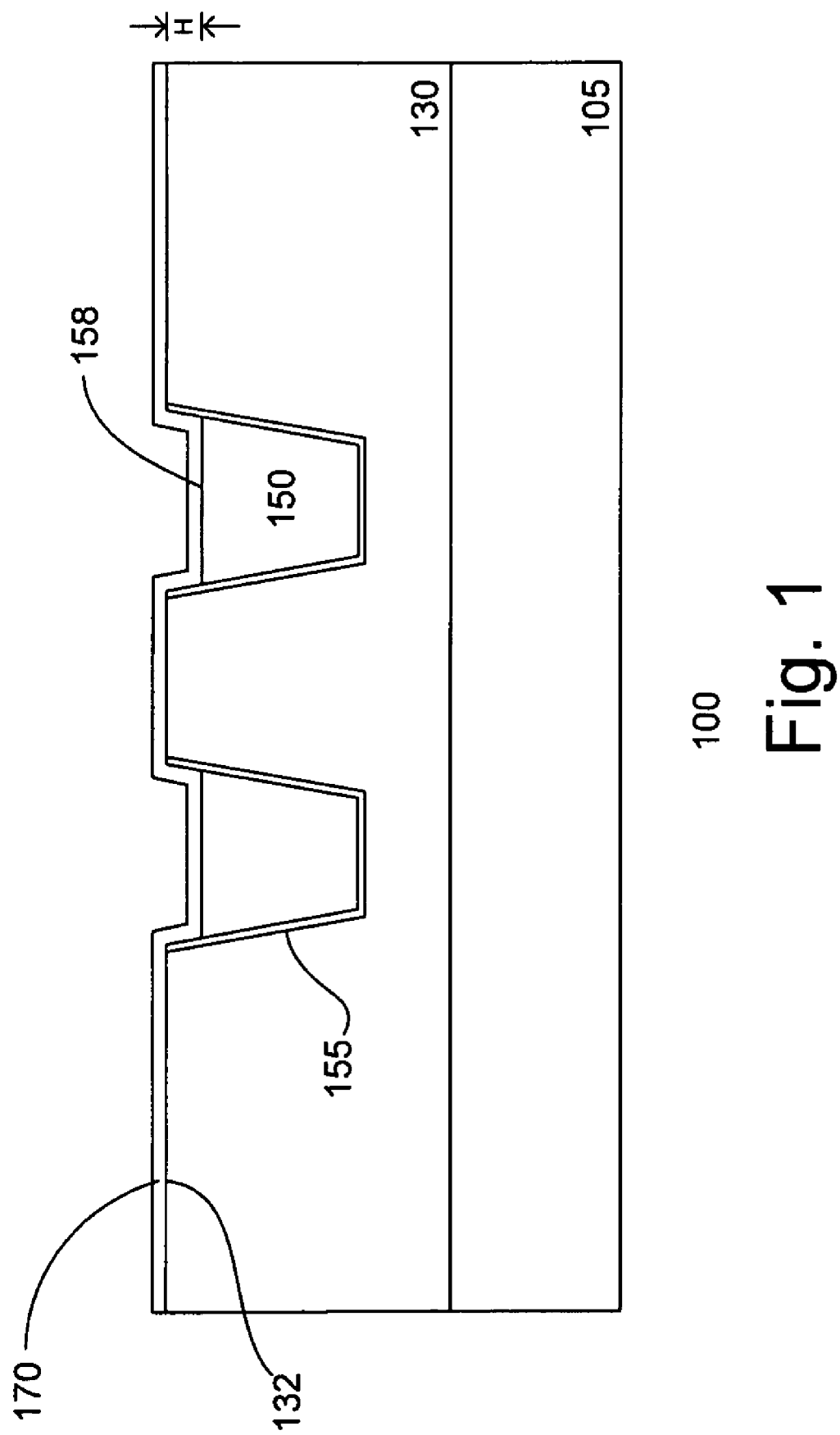
FIG. 1 shows a cross-sectional view of a portion of an embodiment of an IC.

FIG. 1 shows a cross-sectional view of a portion of an integrated circuit (IC) 100 in accordance with one embodiment. As shown, the portion includes a substrate 105. The substrate, for example, comprises a silicon substrate. Other types of substrates, such as silicon germanium or silicon-on-insulator (SOI), are also useful. The substrate may include circuit components (not shown) such as transistors, capacitors, or resistors formed thereon. Other types of circuit components are also useful.

A dielectric layer 130 is disposed on the substrate. The dielectric layer, for example, serves as an interconnect dielectric (ICD) layer in which interconnections are formed. In one embodiment, the ICD includes lower and upper portions. The lower portion serves as an inter-level dielectric (ILD) layer while the upper portion serves as an intra-metal dielectric (IMD) layer. The dielectric layer can be a single layer or multi-layered stack. For example, a single layer can be used to serve as both the ILD and IMD or separate layers are used for the ILD and IMD. In some cases, an etch stop layer can be disposed between the ILD and IMD.

The dielectric layer can comprise, for example, silicon oxide. Other types of dielectric materials are also useful. For example, the dielectric layer can comprise doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and fluorine-doped silicate glass (FSG). Preferably, at least the IMD layer comprises a low-k or ultra low-k dielectric material.

Conductive lines 150 are formed in the IMD portion of the ICD layer. The conductive lines comprise a conductive material such as copper. Other types of metals, alloys or conductive materials are also useful. Contacts (not shown) can be provided in the ILD portion, connecting the conductive lines to contact regions below. Depending on the ICD level, the contact regions can be other metal lines or devices, such as diffusion or gates of transistors. The conductive lines and contacts can comprise the same or different materials. The conductive lines and/or contacts can be provided with slanted sidewalls. The slanted sidewall profile improves sidewall barrier and seed coverage during processing. The slanted sidewalls, for example, comprise an angle of about 85-90°. Other sidewall angles, including non-slanted sidewalls, are also useful.

The conductive lines can include a barrier 155 lining sidewalls and bottoms thereof. The barrier prevents the diffusion of the conductive line material, for e.g. Cu, into the ICD layer. The barrier also serves as an adhesion layer for other conductive line material to better adhere to the dielectric material. The barrier, for example, can comprise tantalum nitride (TaN). Other types of barrier materials, such as tantalum, titanium nitride, ruthenium or a combination thereof, are also useful.

In accordance with one embodiment, a top surface 158 of the conductive lines is disposed below a top surface 132 of the ICD layer by a distance H. Recessing the top surface of the conductive lines below the top surface of the ICD layer increases the effective distance between the conductive lines. This has been found to increase the reliability of the dielectric layer by improving TDDB. In one embodiment, H is sufficient to improve TDDB. In one embodiment, H is about 250-450 Å. Other values of H are also useful.

In one embodiment, an etch stop layer 170 is disposed over the surface of the ICD layer. The etch stop layer covers the ICD and top of the conductive lines. The etch stop layer, in one embodiment, comprises a dielectric material, such as silicon nitride. The etch stop layer can also be a conductive layer, for example a metal layer such as CoWP, or CVD Ru, or a composite of dielectric and conductive material layers. The conductive layer can be deposited by electroless plating or CVD. Other types of etch stop materials or techniques for forming the etch stop layer are also useful. The etch stop layer can also serve as a barrier layer to protect the conductive lines from oxidation. Additionally, it may also be used as an adhesion layer for subsequent layers deposited thereon.

Figure 2:
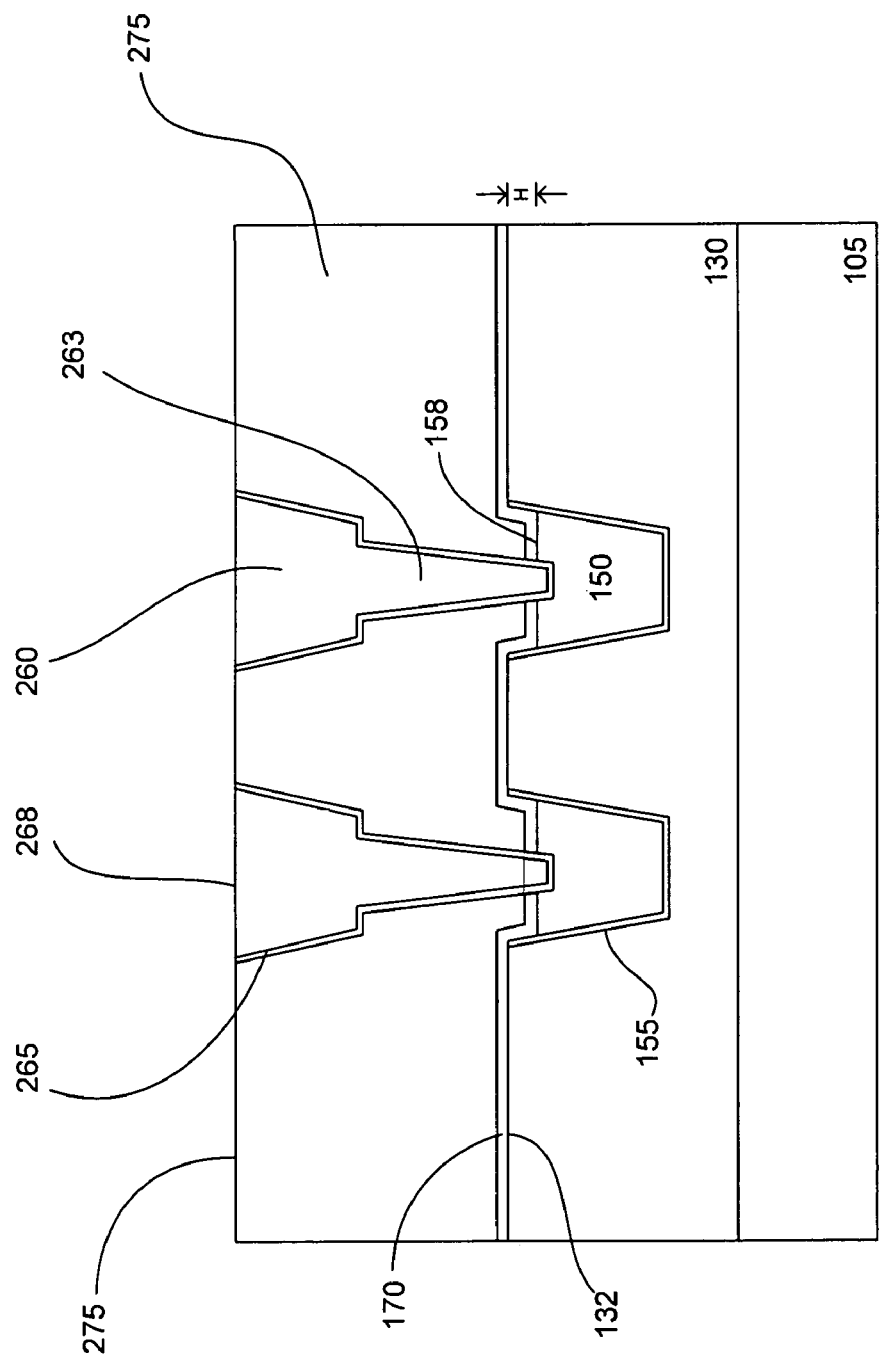
FIG. 2 shows a cross-sectional view of a portion of another embodiment of an IC.

FIG. 2 shows a cross-sectional view of a portion of an integrated circuit (IC) 200 in accordance with one embodiment. The portion, similar to the portion of FIG. 1, includes an ICD layer 130 with interconnects 150 disposed over a substrate 105, wherein a top surface 158 of the conductive lines is recessed below the top surface of the ICD layer 132 by a distance H. In one embodiment, an etch stop layer 170 is disposed over the surface of the ICD layer. The etch stop layer covers the ICD and top of the conductive lines.

Above the ICD layer is disposed a dielectric layer 275. In one embodiment, the dielectric layer serves as another ICD layer of another interconnect level. For example, the first ICD layer 130 serves as the first interconnect level and the second ICD layer 275 serves as the second interconnect level. Additional ICD layers can be provided, corresponding to additional interconnect levels.

The second ICD layer 275, like the first ICD layer 130, includes lower and upper portions corresponding to ILD and IMD. Second ICD layer may comprise a single dielectric layer or multi-layered stack. Conductive lines 260 are disposed in the upper portion of the second ICD layer. Contacts 263 can be provided in the ILD, for example, to couple the conductive lines in the IMD of the second ICD layer to conductive lines or contact regions below. To ensure that the contacts are in electrical communication with the conductive lines below, they extend through the etch stop.

The conductive lines and contacts can include a barrier 265 lining sidewalls and bottoms thereof. The barrier, for example, can comprise TaN. Other types of barrier materials, such as tantalum, titanium nitride, ruthenium or a combination thereof, are also useful. As shown, the top surface of the second ICD layer 275 is coplanar with the top surface of the conductive lines 268. In one embodiment, the top surface of the second ICD layer can be recessed similar to that of the first ICD layer. Additionally, an etch stop layer can be provided over the top surface of the second ICD layer and conductive lines. Furthermore, additional ICD layers can be provided over the second ICD layer corresponding to additional interconnect levels.

Figure 3A:
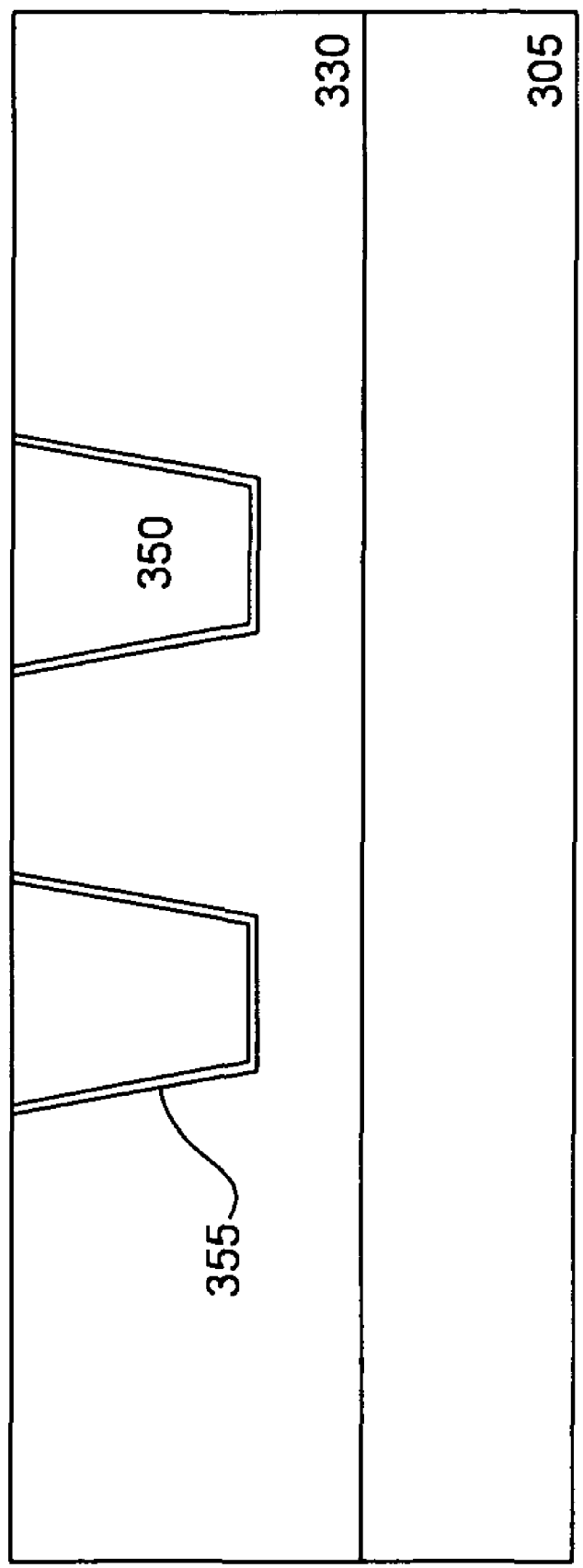
FIGS. 3a-d show a process for forming an embodiment of an IC in accordance with one embodiment of the invention.

FIGS. 3a-d show a process for forming a portion 300 of an IC in accordance with one embodiment. Referring to FIG. 3a, a substrate 305 is provided. The substrate, in one embodiment, comprises a p-type silicon substrate. Other types of substrates, such as a germanium-based, gallium arsenide, silicon-on-insulator (SOI), or sapphire substrate, are also useful. The substrate can be prepared with circuit components (not shown). Circuit components can include, for example, transistors, capacitors and/or resistors. Other types of circuit components are also useful.

The substrate is further prepared with an ICD layer 330. The ICD layer includes an upper or IMD portion and a lower or ILD portion. The ICD can be a single layer or multi-layered stack. For example, a single layer can be used to serve as both the ILD and IMD or separate layers are used for the ILD and IMD. In some cases, an etch stop layer can be disposed between the ILD and IMD. The ICD layer can comprise, for example, silicon oxide. Other types of dielectric materials are also useful. For example, the dielectric layer can comprise doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and fluorine-doped silicate glass (FSG). Preferably, at least the IMD layer comprises a low-k or ultra low-k dielectric material.

The ICD layer or layers can be deposited using various types of deposition techniques. For example, chemical vapor deposition (CVD) processes such as plasma enhanced (PECVD), high density (HDCVD), atmospheric pressure (APCVD) can be used. Other techniques such as spin-on processes are also useful. The specific process, for example, can depend on the type of material used and application. The ICD layer may be planarized to improve subsequent processing, such as pattern transfer processes.

Conductive lines 350 and contacts (not shown) are formed in the IMD and ILD portions, respectively, of the ICD layer. Various techniques such as damascene or dual damascene techniques can be used. Other techniques, such as reactive ion etching (RIE), can also be useful. The conductive lines and contacts can be formed from the same material or from different materials. The conductive lines and/or contacts can be provided with slanted sidewalls. The slanted sidewalls, for example, comprise an angle of about 85-90°. Providing conductive lines and/or contacts with non-slanted sidewalls is also useful.

For example, in a dual damascene process, via openings and trenches are formed in the ICD layer to produce dual damascene structures. A barrier 355 can be deposited on the substrate, lining the surface of the ICD and dual damascene structures. The barrier, for example, can comprise TaN. Other types of barrier materials, such as tantalum, titanium nitride, ruthenium or a combination thereof, are also useful. The barrier can be formed by, for example, PVD, CVD or atomic layer deposition (ALD). Other techniques for forming the barrier are also useful.

A conductive material is deposited on the substrate covering barrier and filling the dual damascene structure. The conductive material, for example, comprises copper, aluminum, tungsten, alloys such as Al doped Cu, Mn doped Cu, or a combination thereof. Other types of conductive materials, including metals and alloys, are also useful. In one embodiment, the conductive material comprises copper. The conductive material can be deposited by electro-plating. Other techniques, such as electro-less plating, CVD, PVD or sputtering, are also useful.

Excess material on the surface of the ICD layer is removed by a planarizing process to form a planar surface with the top of the ICD layer. For example, excess conductive and barrier materials on the surface of the ICD layer are removed by a polishing process, such as chemical mechanical polishing. Other types of planarizing or polishing processes are also useful. The polishing process may include multiple polishing steps to remove the different materials, such as conductive and barrier materials. Similar to dual damascene process, a planarizing process can be used to form a planar surface between the vias and ILD and a planar surface between the conductive lines and IMD.

Figure 3B:
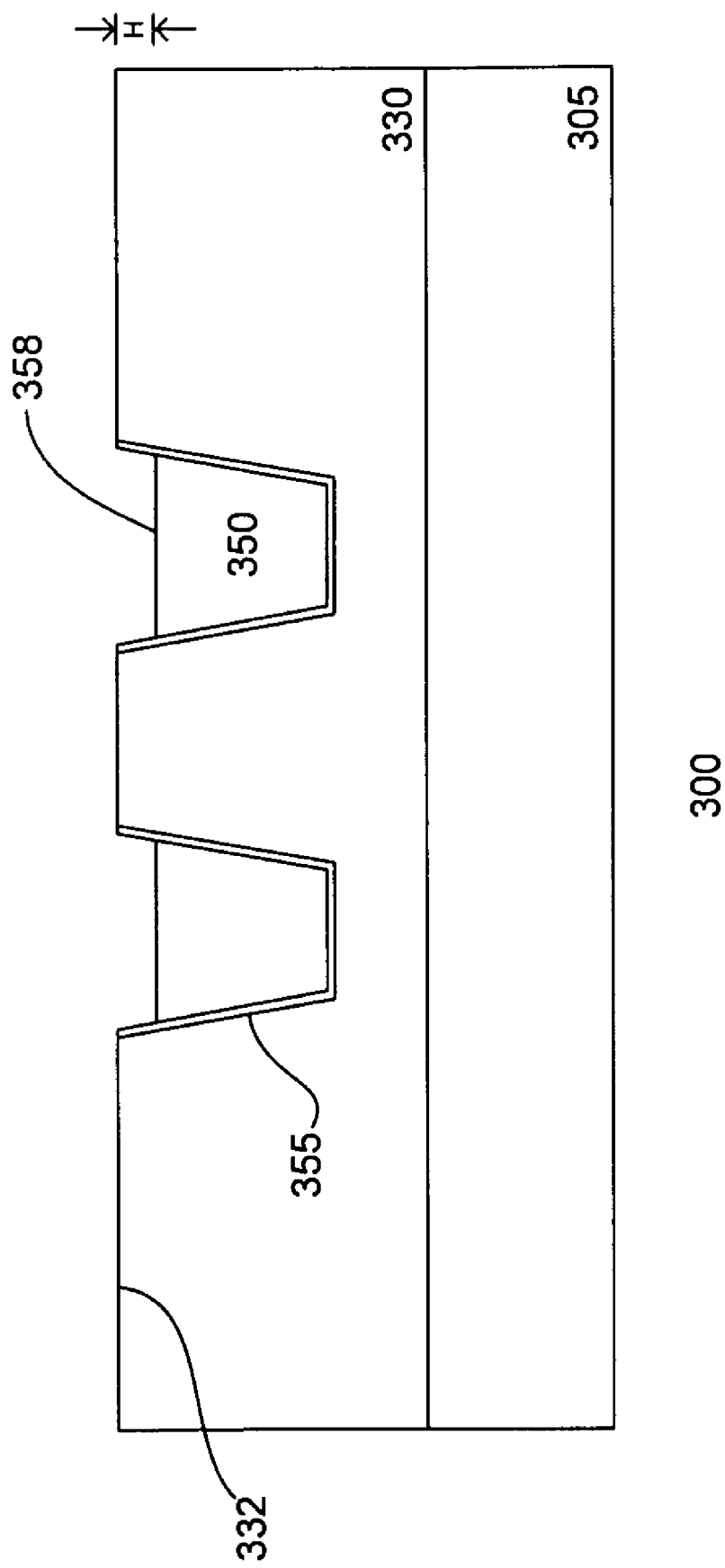

Referring to FIG. 3b, the conductive lines are recessed, wherein a top surface 358 of the conductive lines are recessed below the top surface 332 of the ICD layer by a distance H, creating a stepped topography. In one embodiment, H is about 250-450 Å. Other values of H are also useful. By creating a stepped topography, the effective distance between metal lines can be increased. This improves the TDDB of the ICD, thereby enhancing reliability.

In one embodiment, a reverse electrochemical plating is performed to recess the conductive lines below the surface of the ICD layer. For example, e-CMP can be used to recess the conductive lines. Other techniques can also be used to recess the conductive lines. The conductive material can be over polished by CMP. Alternatively, etch back techniques, for example, selective etch back, are also useful.

Figure 3C:
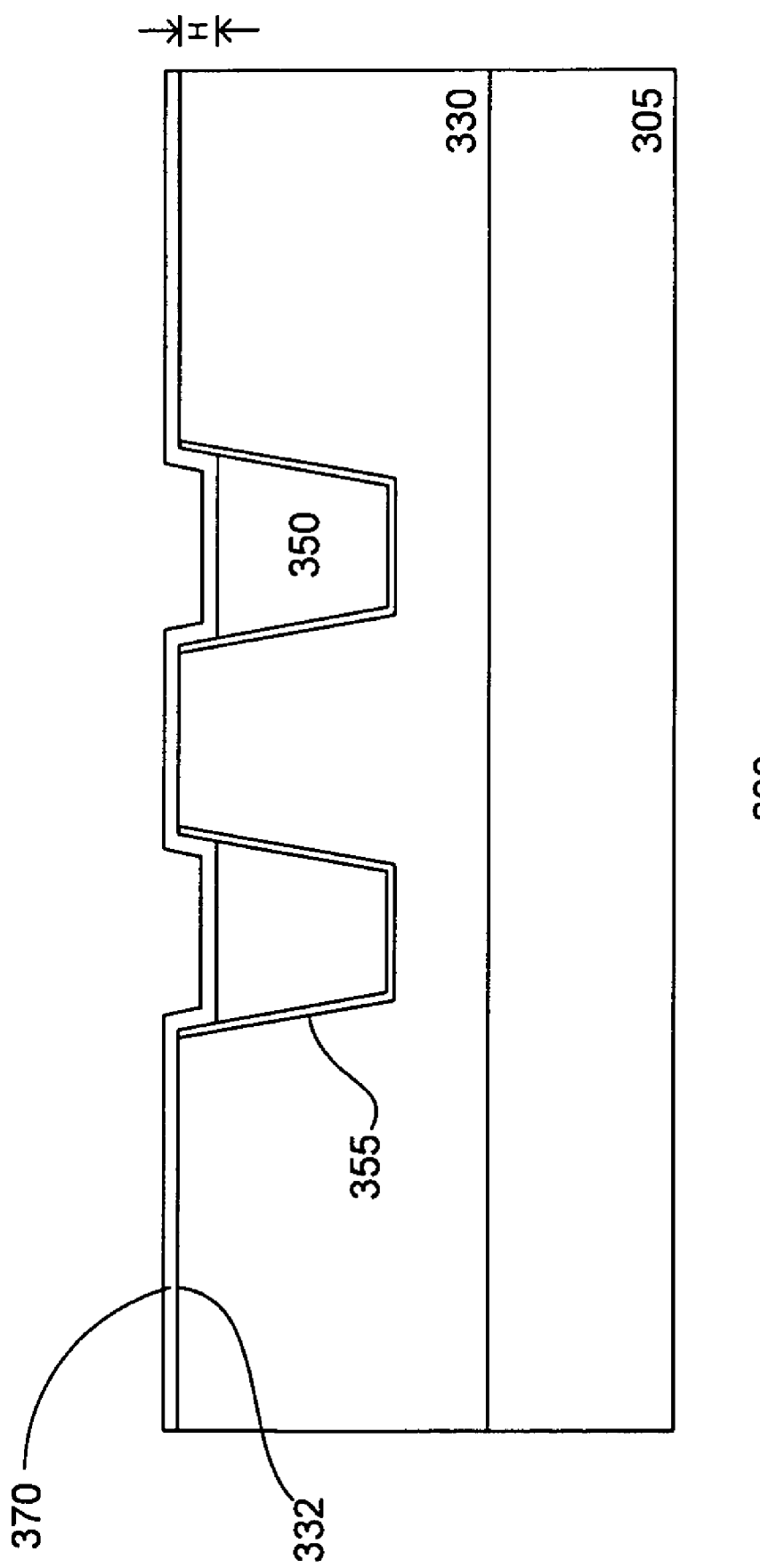
Figure 3D:
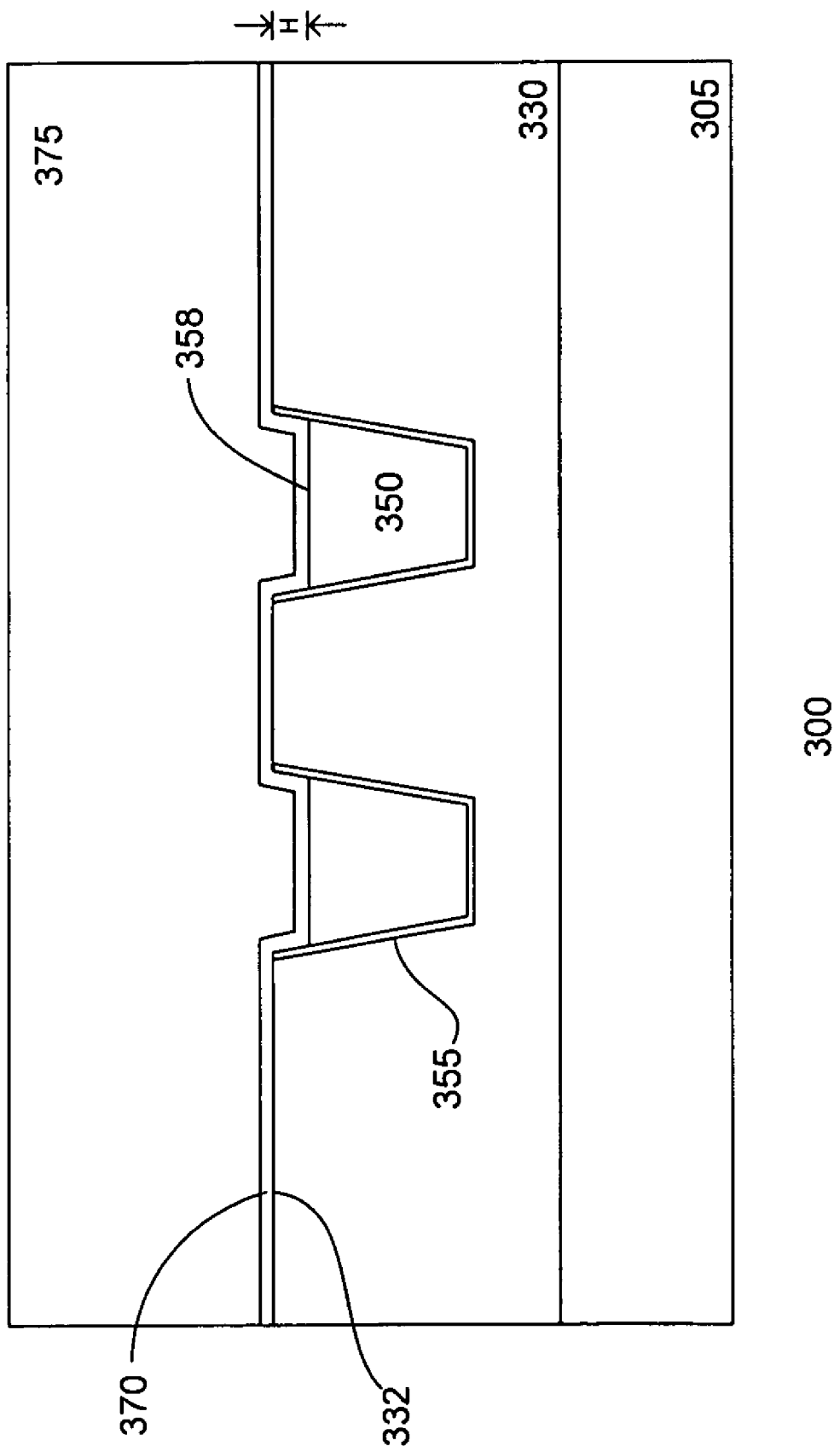

Referring to FIG. 3c, an etch stop layer 370 is deposited on the substrate, covering the top of the ICD and conductive lines. In one embodiment, the etch stop layer comprises silicon nitride. The etch stop layer can also be a conductive layer, for example a metal layer such as CoWP, or a composite of dielectric and metal layers. The etch stop layer, for example, is deposited by CVD or electroless-plating. Other techniques for depositing the etch stop layer is also useful. The thickness of the etch stop layer is about 350-450 Å for dielectric material such as silicon nitride or 40-60 Å for conductive material such as CoWP. Other thicknesses are also useful. An additional dielectric layer 375 as shown in FIG. 3d can be formed over the etch stop layer 370. The dielectric layer, for example, serves as an additional ICD layer corresponding to an additional interconnect level. For example, conductive lines and contacts can be formed in the additional ICD layer.

The process continues to form the IC. For example, additional processing can include forming more ICD layers and interconnections, final passivation, dicing, assembly and packaging. Other processes are also useful.

Figure 4:
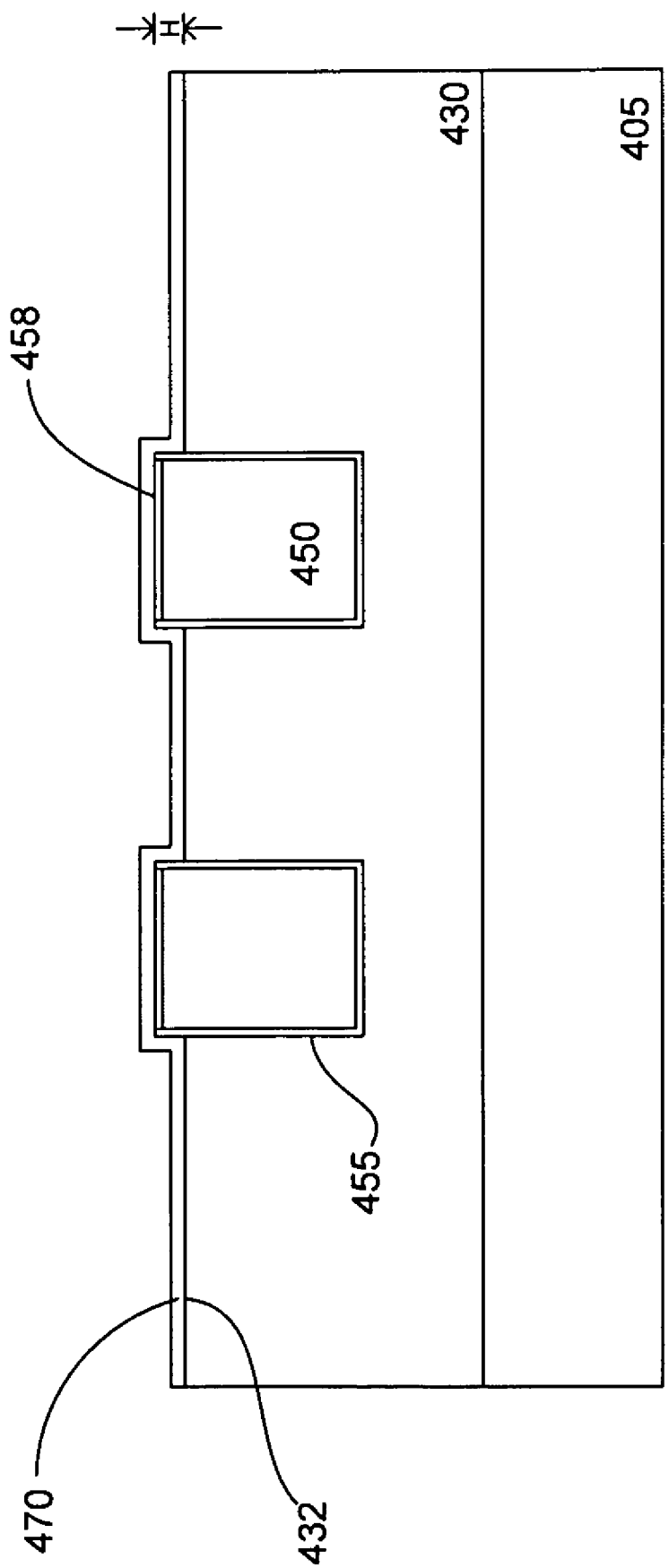
FIG. 4 shows a cross-sectional view of a portion of yet another embodiment of an IC.

FIG. 4 shows a cross-sectional view of another embodiment of a portion of an IC 400. As shown, the portion includes a substrate 405. The substrate, for example, comprises a silicon substrate. Other types of substrates, such as silicon germanium or SOI, are also useful. The substrate may include circuit components (not shown) such as transistors, capacitors, or resistors formed thereon. Other types of circuit components are also useful.

A dielectric layer 430 is disposed on the substrate. The dielectric layer, for example, serves as an ICD layer in which interconnections are formed. In one embodiment, the ICD includes lower and upper portions. The lower portion serves as an ILD layer while the upper portion serves as an IMD layer. The dielectric layer can be a single layer or multi-layered stack. For example, a single layer can be used to serve as both the ILD and IMD or separate layers are used for the ILD and IMD. In some cases, an etch stop layer can be disposed between the ILD and IMD.

The dielectric layer can comprise, for example, silicon oxide. Other types of dielectric materials are also useful. For example, the dielectric layer can comprise doped silicon oxide such as FSG, undoped or doped silicate glasses such as BPSG and PSG, undoped or doped thermally grown silicon oxide, undoped or doped TEOS deposited silicon oxide, and low-k or ultra low-k dielectric materials such as OSG and FSG. Preferably, at least the IMD layer comprises a low-k or ultra low-k dielectric material.

Interconnect lines 450 are formed in the IMD portion of the ICD layer. The interconnect lines comprise a conductive material such as copper. Other types of metals, alloys or conductive materials are also useful. Contacts (not shown) can be provided in the ILD portion, connecting the interconnect lines to contact regions below. Depending on the ICD level, the contact regions can be other metal lines or devices, such as diffusion or gates of transistors. The conductive lines and contacts can comprise the same or different materials. The conductive lines and/or contacts can be provided with vertical or substantially vertical sidewalls. Providing conductive lines and/or contacts with slanted sidewalls is also useful.

The interconnect lines can include a barrier 455 lining sidewalls and bottoms thereof. The barrier prevents the diffusion of the conductive line material, for e.g. Cu, into the ICD layer. The barrier also serves as an adhesion layer for other conductive line material to better adhere to the dielectric material. The barrier, for example, can comprise tantalum nitride (TaN). Other types of barrier materials, such as tantalum, titanium nitride, ruthenium or a combination thereof, are also useful. A cap layer 458 can be provided over the interconnect lines to passivate the conductive lines. It may also be used as an adhesion layer for subsequent layers form thereon. The cap layer may comprise cobalt tungsten phosphide (CoWP). Other types of capping materials, for example silicon nitride, are also useful.

In accordance with one embodiment, a top surface 432 of the ICD layer is disposed below top surfaces of the interconnect lines by a distance H. Providing the top surface of the ICD layer below the top surface of the interconnect line increases the effective distance between the interconnect lines. This has been found to increase the reliability of the dielectric layer by improving TDDB. In one embodiment, H is sufficient to improve TDDB. In one embodiment, H is about 250-450 Å. Other values of H are also useful.

In one embodiment, an etch stop layer 470 is disposed over the surface of ICD layer. The etch stop layer covers the ICD and top of the interconnect lines. The etch stop layer, in one embodiment, comprises a dielectric material, such as silicon nitride. Other types of etch stop materials are also useful. The etch stop layer can also serve as a barrier layer to protect the interconnect lines from oxidation.

Figure 5:
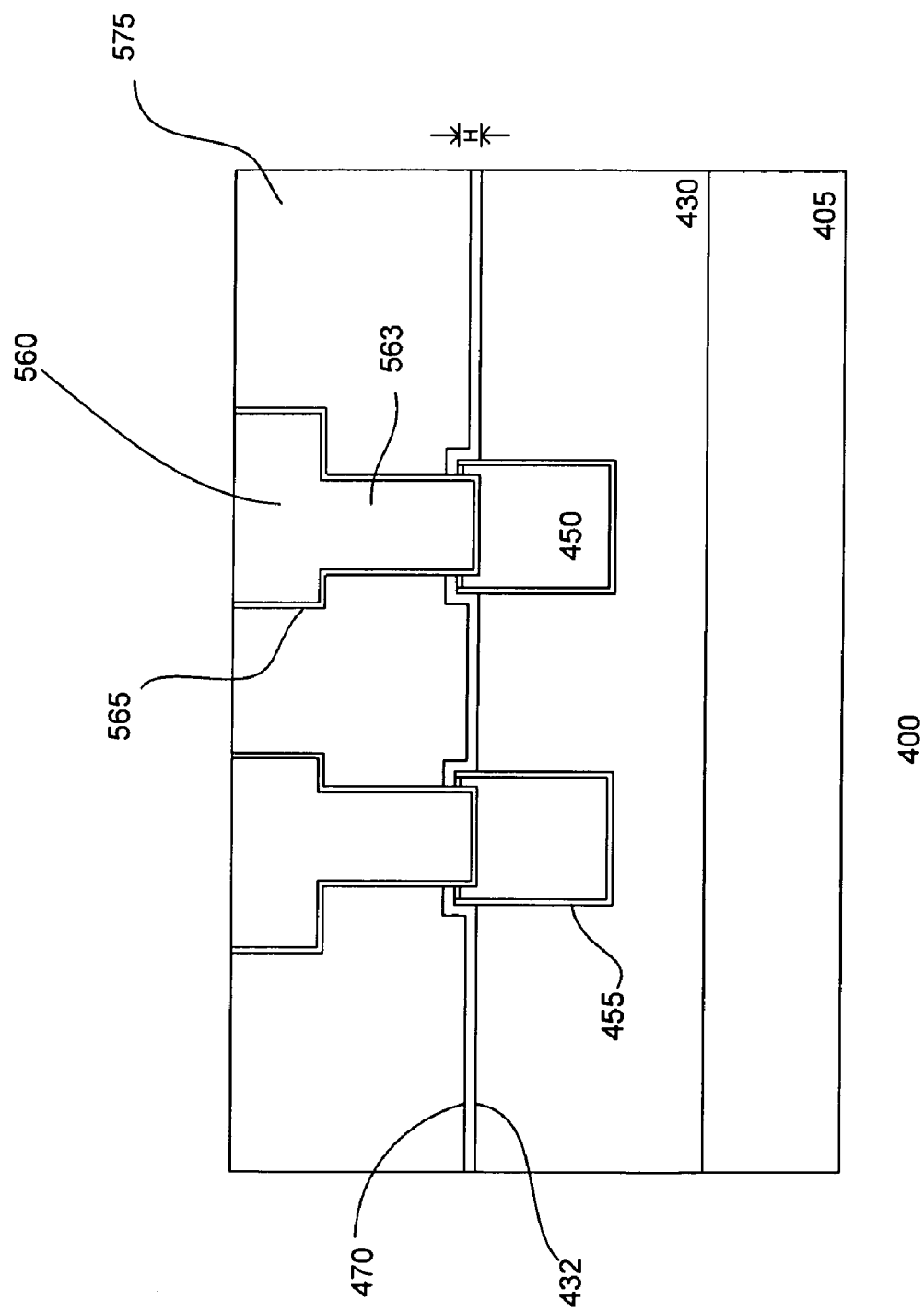
FIG. 5 shows a cross-sectional view of a portion of another embodiment of an IC.

FIG. 5 shows a cross-sectional view of yet another portion of an IC 500. The portion, similar to the portion of FIG. 4, includes an ICD layer 430 with interconnects 450 disposed over a substrate 405, wherein a top surface 432 of the ICD layer is recessed below a top surface of the interconnect lines by a distance H. In one embodiment, an etch stop layer 470 is disposed over the surface of the ICD layer. The etch stop layer covers the ICD and top of the interconnect lines.

Above the ICD layer is disposed a dielectric layer 575. In one embodiment, the dielectric layer serves as another ICD layer of another interconnect level. For example, the first ICD layer 430 serves as the first interconnect level and the second ICD layer 575 serves as the second interconnect level. Additional ICD layers can be provided, corresponding to additional interconnect levels.

The second ICD layer 575, like the first ICD layer 430, includes lower and upper portions corresponding to ILD and ICD. Second ICD layer may comprise a single dielectric layer or multi-layered stack. Conductive lines 560 are disposed in the upper portion of the second ICD layer. Contacts 563 can be provided in the lower portion, for example, to couple the conductive lines in the second ICD layer to conductive lines or contact regions below. To ensure that the contacts are in electrical communication with the conductive lines below, they extend through the etch stop and cap layers. The conductive lines and contacts preferably comprise the same material. Providing conductive lines and contacts comprising different materials is also useful. The conductive lines and/or contacts can be provided with vertical or substantially vertical sidewalls. Providing conductive lines and/or contacts with slanted sidewalls is also useful.

The interconnect lines and contacts can include a barrier 565 lining sidewalls and bottoms thereof The barrier, for example, can comprise TaN. Other types of barrier materials, such as tantalum, titanium nitride, ruthenium, are also useful. A cap layer can also be provided over the interconnect lines. The cap layer, for example, comprises CoWP. Other types of capping materials are also useful.

As shown, the top surface of the second ICD layer 575 is coplanar with the top surface of the conductive lines 560. In one embodiment, the top surface of the second ICD layer can be recessed similar to that of the first ICD layer. Additionally, an etch stop layer can be provided over the top surface of the second ICD layer and conductive lines. Furthermore, additional ICD layers can be provided over the second ICD layer corresponding to additional interconnect levels.

Figure 6A:
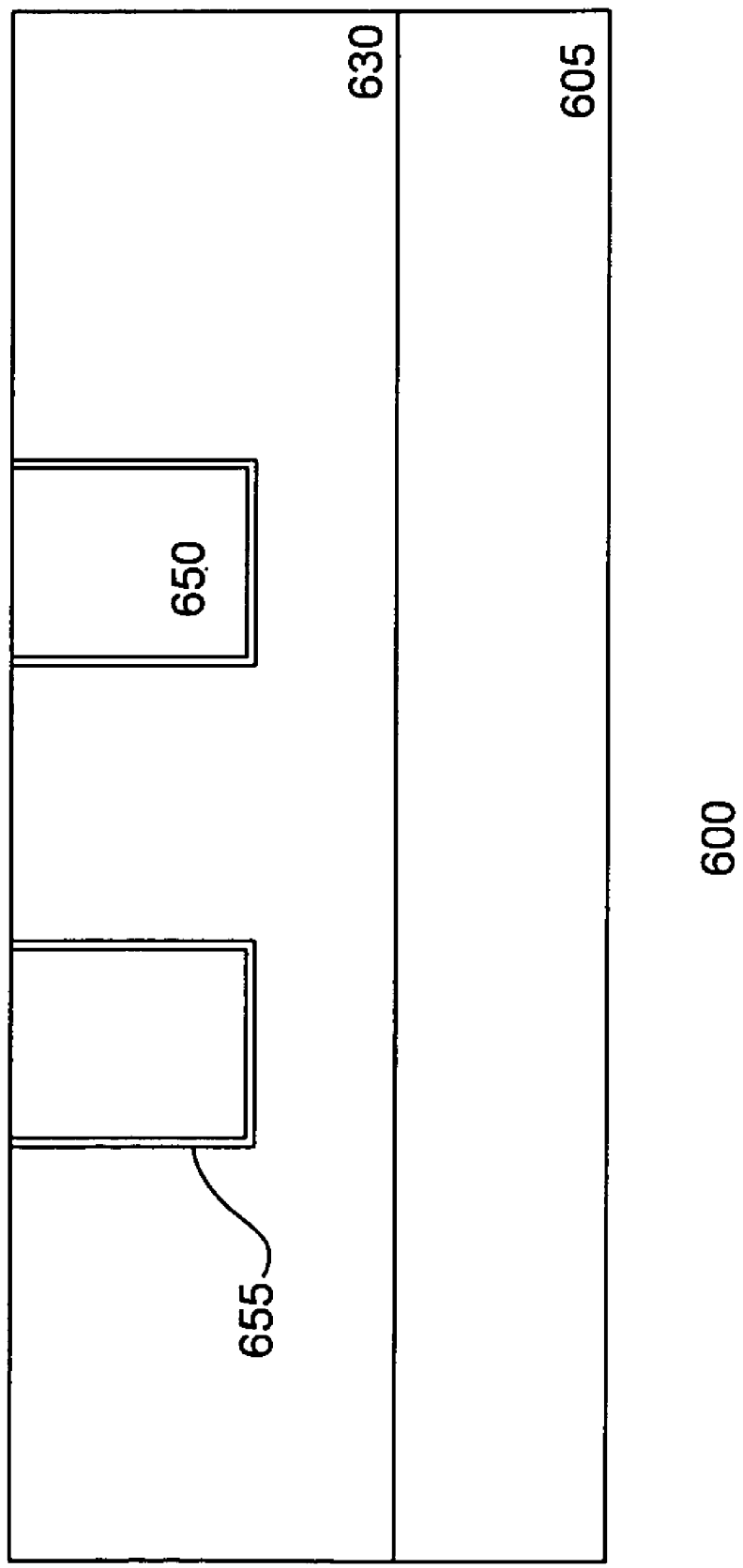
FIGS. 6a-d show a process for forming another embodiment of an IC in accordance with one embodiment of the invention.

FIGS. 6a-d show a process for forming an embodiment of a portion 600 of an IC. Referring to FIG. 6a, a substrate 605 is provided. The substrate, in one embodiment, comprises a p-type silicon substrate. Other types of substrates, such as a germanium-based, gallium arsenide, SOI, or sapphire substrate, are also useful. The substrate can be prepared with circuit components (not shown). Circuit components can include, for example, transistors, capacitors and/or resistors. Other types of circuit components are also useful.

The substrate is further prepared with an ICD layer 630. The ICD layer includes an upper or IMD portion and a lower or ILD portion. The ICD can be a single layer or multi-layered stack. For example, a single layer can be used to serve as both the ILD and IMD or separate layers are used for the ILD and IMD. In some cases, an etch stop layer can be disposed between the ILD and IMD. The ICD layer can comprise, for example, silicon oxide. Other types of dielectric materials are also useful. For example, the dielectric layer can comprise doped silicon oxide such as FSG, undoped or doped silicate glasses such as BPSG and PSG, undoped or doped thermally grown silicon oxide, undoped or doped TEOS deposited silicon oxide, and low-k or ultra low-k dielectric materials such as OSG and FSG. Preferably, at least the IMD layer comprises a low-k or ultra low-k dielectric material.

The ICD layer or layers can be deposited using various types of deposition techniques. For example, CVD processes such as PECVD, HDCVD or APCVD can be used. Other techniques such as spin-on processes are also useful. The specific process, for example, can depend on the type of material used and application.

Conductive lines 650 and contacts (not shown) are formed in the IMD and ILD portions, respectively, of the ICD layer. The conductive lines and contacts can be formed from a conductive material, such as copper, aluminum, tungsten, alloys thereof or a combination thereof. Other types of conductive materials, including metals and alloys, such as Al doped Cu or Mn doped Cu, are also useful. The conductive lines and contacts can be formed using damascene or dual damascene processes. Other techniques, such as RIE, can also be useful. The conductive lines and contacts can be formed from the same material or from different materials. The conductive lines and/or contacts can be provided with vertical or substantially vertical sidewalls. Providing conductive lines and/or contacts with slanted sidewalls is also useful.

A barrier 655 can be provided to line the conductive lines and/or contacts. The barrier, for example, can comprise TaN. Other types of barrier materials are also useful. The barrier can be formed by, for example, CVD. Other types of techniques for forming the barrier layer are also useful. To produce a planar top surface between the ICD and conductive lines, a planarizing process, such as chemical mechanical polish, can be employed. Other types of planarizing processes can also be useful.

Figure 6B:
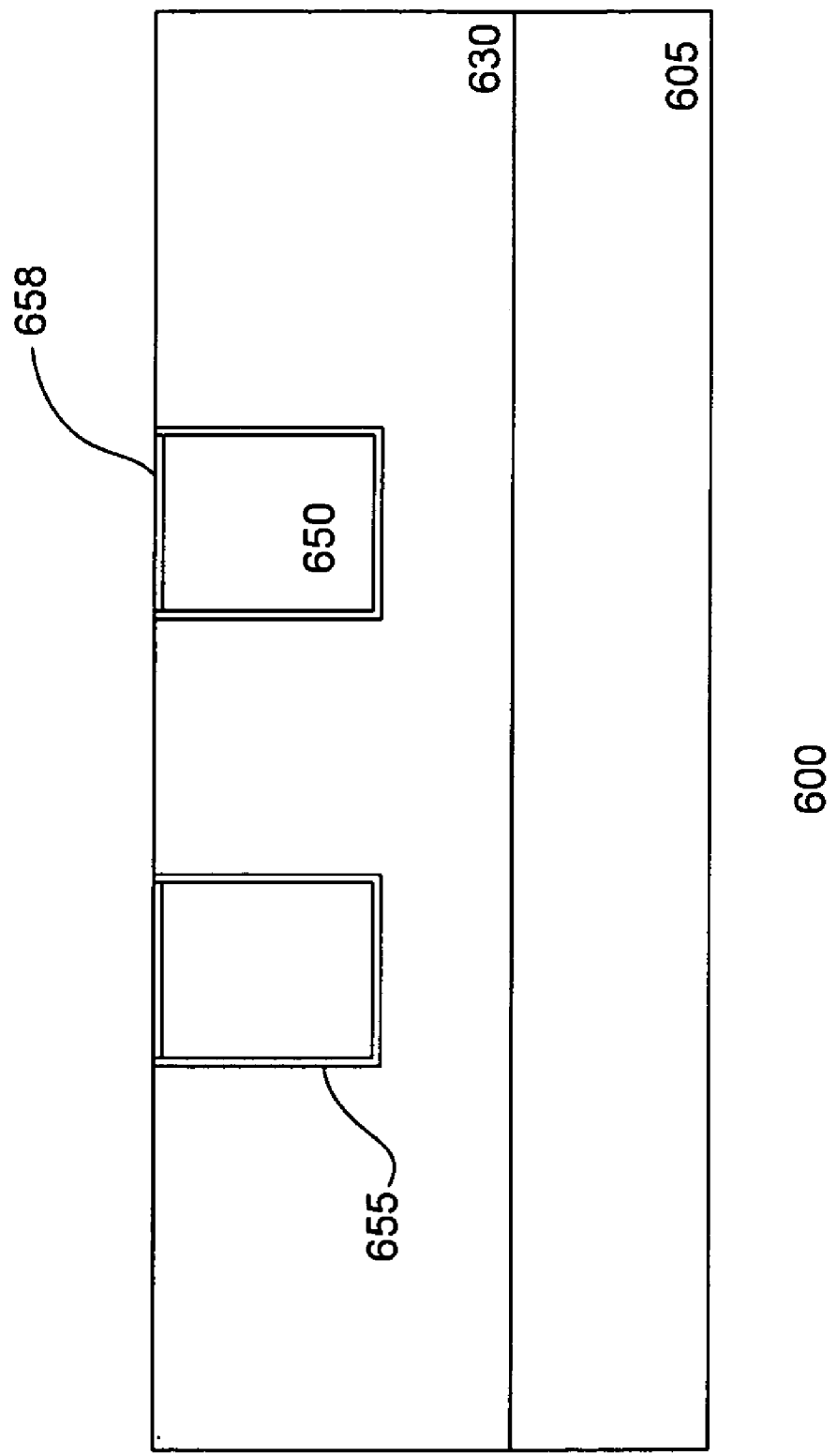

A cap layer 658 is optionally formed over the surface of the conductive lines 650, as shown in FIG. 6b. The cap layer, for example, comprises CoWP. Other types of cap materials are also useful. The cap layer, for example, passivates the conductive lines. It can also serve as an adhesion layer for subsequent layers formed thereon. In one embodiment, the cap layer is formed by selective electroless plating. Other techniques for forming the cap layer are also useful.

Figure 6C:
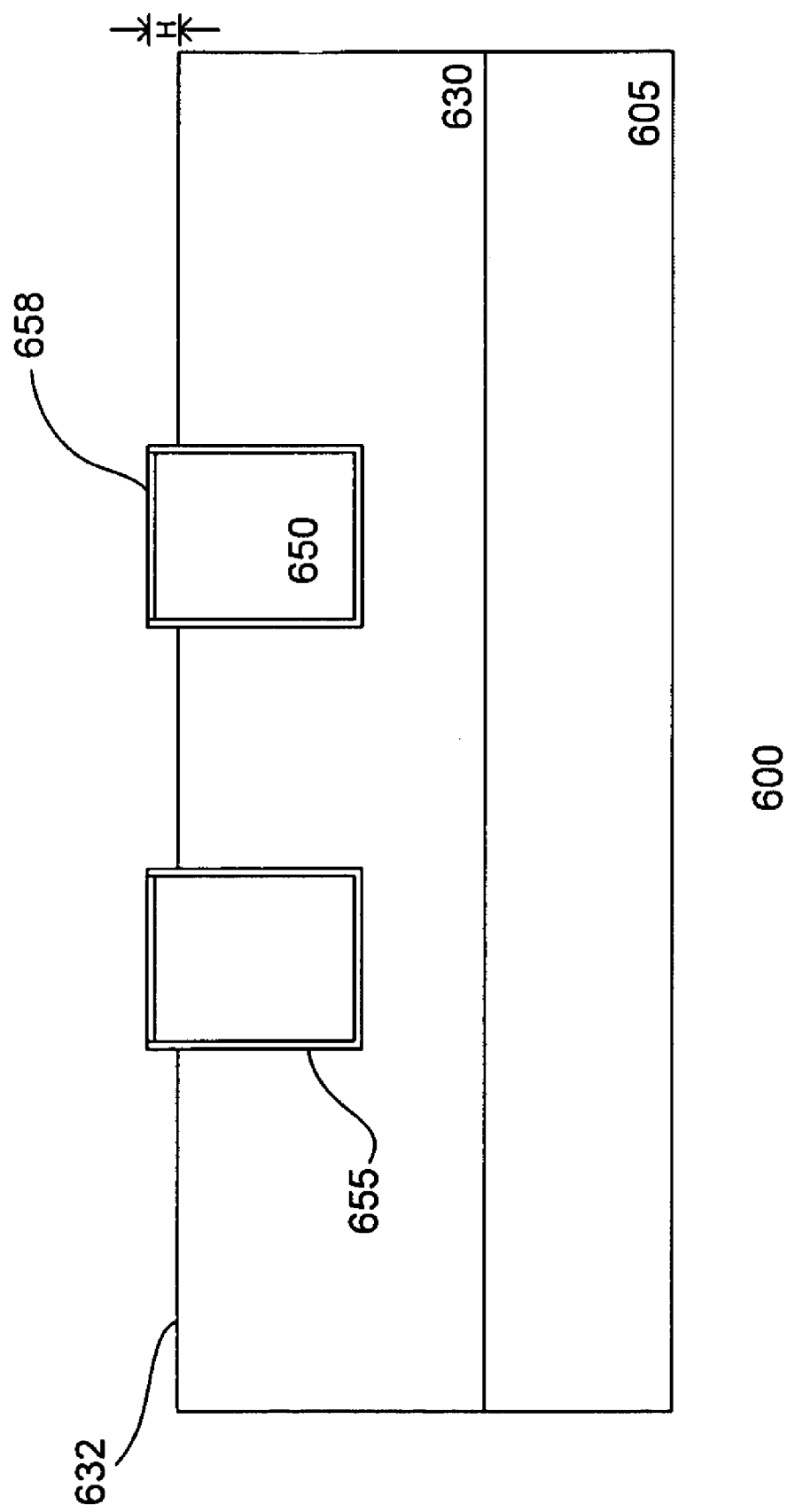

Referring to FIG. 6c, the top surface 632 of the ICD layer is recessed by H to produce a stepped topography. The top surface 632, in one embodiment, is recessed sufficiently to improve TDDB. In one embodiment, H is about 250-450 Å. Other values of H are also useful. In one embodiment, the top surface of the ICD is recessed by over polishing during the CMP step. For example, the top surface is over-buffed to recess it. Alternatively, a RIE can be performed to remove the ICD selective to the conductive lines. The cap layer, for example, protects the copper from damage during RIE. Employing both over-polishing and RIE to form the recess can also be useful. Other techniques for forming the stepped topography are also useful.

Figure 6D:
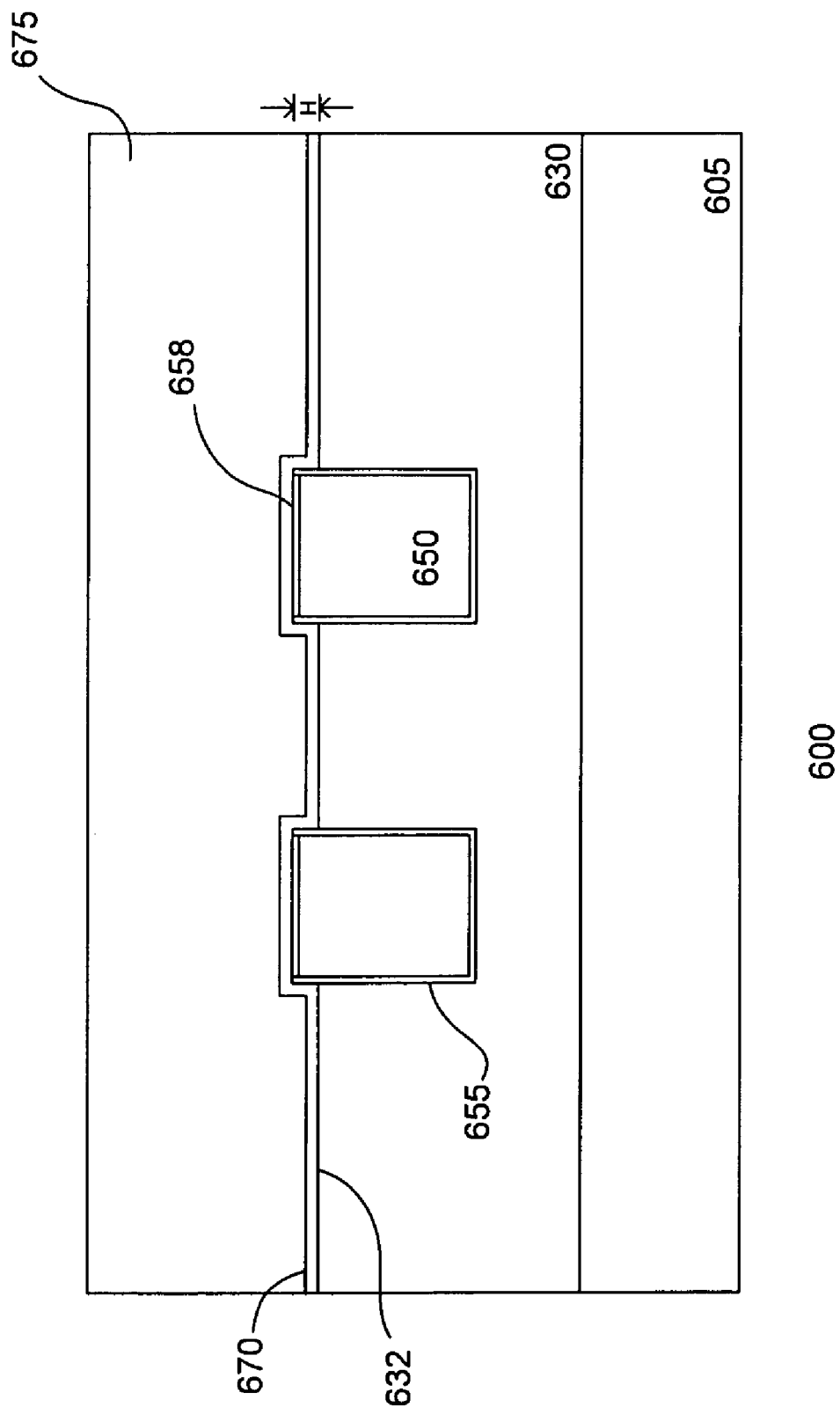

Referring to FIG. 6d, an etch stop layer 670 is deposited on the substrate, covering the top of the ICD and conductive lines. In one embodiment, the etch stop layer comprises silicon nitride. The etch stop layer can comprise a conductive layer, for example a metal layer such as CoWP or a composite of dielectric and metal material layers. The etch stop layer, for example, is deposited by CVD or electroless-plating. Other techniques for depositing the etch stop layer is also useful. The thickness of the etch stop layer is about 350-450 Å for dielectric material such as silicon nitride or 40-60 Å for metallic material such as CoWP. Other thicknesses are also useful. An additional ICD layer 675 can be formed over the etch stop layer 670 corresponding to an additional interconnect level. For example, conductive lines and contacts can be formed in the additional ICD layer 675.

The process continues to form the IC. For example, additional processing can include forming more ICD layers and interconnections, final passivation, dicing, assembly and packaging. Other processes are also useful.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the forego-

What is claimed is:

1. A method for forming a semiconductor device comprising:
   providing a substrate prepared with a dielectric layer formed thereon, the dielectric layer includes a trench in an upper portion of the dielectric layer with a conductive line;
   processing the substrate to produce a conductive top surface of the conductive line which is non-coplanar with a dielectric top surface of the dielectric layer to form a stepped topography; and
   forming a conformal dielectric cap layer over the substrate covering the dielectric layer and directly contacting the conductive top surface of the conductive line, wherein a cap top surface of the conformal dielectric cap layer over the top conductive surface is non-coplanar with the dielectric top surface of the dielectric layer, wherein forming the stepped topography increases the effective distance between conductive lines to enhance interconnect reliability.

2. The method of claim 1 wherein processing comprises recessing the conductive line causing the conductive top surface of the conductive line to be below the dielectric top surface of the dielectric layer.

3. The method of claim 1 wherein the conductive top surface of the conductive line is disposed below the dielectric top surface of the dielectric layer by a distance H to improve time dependent dielectric breakdown (TDDB).

4. The method of claim 1 comprises forming a barrier lining sidewalls and bottom of the conductive line.

5. The method of claim 1 comprises providing a second dielectric layer on top of the dielectric layer, wherein the second dielectric layer comprises a conductive line and contact, the contact couples the conductive line of the second dielectric layer to the conductive line below.

6. The method of claim 5 comprises forming a barrier lining sidewalls and bottom of the conductive line and contact.

7. The method of claim 1 wherein processing comprises recessing the dielectric layer to result in the conductive top surface of the conductive line being above the dielectric top surface of the dielectric layer.

8. A method for forming a semiconductor device comprising:
   providing a substrate prepared with a dielectric layer formed thereon, the dielectric layer having a conductive line disposed in an upper portion of the dielectric layer;
   processing the substrate to produce a conductive top surface of the conductive line which is non-coplanar with a dielectric top surface of the dielectric layer to form a stepped topography; and
   forming a dielectric cap layer over the dielectric layer, the dielectric cap layer directly contacting the conductive top surface, wherein the stepped topography improves TDDB.

9. The method of claim 8 wherein the dielectric top surface of the dielectric layer is below or above the conductive top surface of the conductive line by a distance H.

10. The method of claim 9 wherein the distance H is about 250-450 Å.

11. The method of claim 8 comprises forming a barrier lining sidewalls and bottom of the conductive line.

12. The method of claim 8 comprises providing a second dielectric layer on top of the dielectric layer, wherein the second dielectric layer comprises a conductive line and contact, the contact couples the conductive line of the second dielectric layer to the conductive line below.

13. The method of claim 12 comprises forming a barrier lining sidewalls and bottom of the conductive line and contact.

14. The method of claim 8 wherein processing comprises recessing the conductive line causing the conductive top surface to be sufficiently below the dielectric top surface so that the cap top surface is below the dielectric top surface.

15. The method of claim 8 wherein processing comprises recessing the dielectric layer wherein the conductive top surface of the conductive line is above the dielectric top surface of the dielectric layer.

16. A method for forming a device comprising:
   providing a substrate prepared with a dielectric layer formed thereon, the dielectric layer having a conductive line disposed in an upper portion of the dielectric layer;
   processing the substrate to produce a conductive top surface of the conductive line which is non-coplanar with a dielectric top surface of the dielectric layer to form a stepped topography; and
   forming a conformal dielectric cap layer over the substrate covering the dielectric layer and directly contacting the conductive top surface of the conductive line, wherein the dielectric top surface of the dielectric layer is non-coplanar with a cap top surface over the conductive line to improve TDDB.

17. The method of claim 16 wherein the conductive top surface of the conductive line is disposed below the dielectric top surface of the dielectric layer by a distance H to improve TDDB.

18. The method of claim 17 comprises forming a barrier lining sidewalls and bottom of the conductive line and contact.

19. The method of claim 16 wherein the conductive top surface of the conductive line is disposed above the dielectric top surface of the dielectric layer by a distance H to improve TDDB.

20. The method of claim 19 comprises forming a barrier lining sidewalls and bottom of the conductive line and contact.

* * * * *